(12) United States Patent
Tzeng et al.

(10) Patent No.: US 8,587,463 B2
(45) Date of Patent: Nov. 19, 2013

(54) SIGNAL STATISTICS AND COMPRESSION-BASED ANALOG-TO-DIGITAL CONVERTERS

(75) Inventors: Fred Tzeng, Laguna Niguel, CA (US); Payam Heydari, Irvine, CA (US)

(73) Assignee: The Regents of the University of California, Oakland, CA (US)

( * ) Notice: Subject to any disclaimer, the term of this patent is extended or adjusted under 35 U.S.C. 154(b) by 101 days.

(21) Appl. No.: 13/210,991

(22) Filed: Aug. 16, 2011

(65) Prior Publication Data

US 2012/0038499 A1  Feb. 16, 2012

Related U.S. Application Data

(60) Provisional application No. 61/373,949, filed on Aug. 16, 2010.

(51) Int. Cl.
*H03M 1/12* (2006.01)

(52) U.S. Cl.
USPC ............................ 341/155; 341/136; 341/143

(58) Field of Classification Search
USPC .................. 341/155, 110, 136, 156, 143, 200
See application file for complete search history.

(56) References Cited

U.S. PATENT DOCUMENTS

| | | |
|---|---|---|
| 4,540,974 A | 9/1985 | Schanne et al. |
| 4,599,603 A | 7/1986 | Sakai et al. |
| 4,626,827 A | 12/1986 | Kitamura et al. |
| 5,506,801 A | 4/1996 | Tawel |
| 5,760,730 A | 6/1998 | Fischer et al. |
| 5,894,283 A | 4/1999 | Fischer et al. |
| 6,229,469 B1 | 5/2001 | Gaudet |
| 6,864,817 B1 | 3/2005 | Salvi et al. |
| 7,009,533 B1 * | 3/2006 | Wegener .......................... 341/76 |
| 7,142,145 B1 | 11/2006 | Lauritzen et al. |
| 7,158,061 B1 * | 1/2007 | Feng et al. ..................... 341/138 |
| 7,292,164 B1 | 11/2007 | Wegener |
| 7,808,411 B2 | 10/2010 | Groiss |
| 7,876,252 B1 | 1/2011 | Wegener |
| 2003/0078007 A1 * | 4/2003 | Parssinen et al. ............ 455/67.1 |
| 2003/0188005 A1 * | 10/2003 | Yoneda et al. ................ 709/231 |

* cited by examiner

*Primary Examiner* — Jean B Jeanglaude
(74) *Attorney, Agent, or Firm* — Kenneth S. Roberts; One LLP (57) ABSTRACT

A method of adaptively and losslessly quantizing an analog signal to a digital signal in an analog-to-digital converter (ADC), is disclosed. According to one embodiment, the quantizing is based on one or more of an instantaneous amplitude of the analog signal, frequencies of the analog signal, and patterned contents of the analog signal, and the method comprises sampling the analog signal; quanitizing the analog signal by a quantizer core, wherein the quantizer core comprises a digital-to-analog converter (DAC), a comparator, and a voltage reference, wherein the quantization is one of efficient lossless and adaptive compression quantization, or a traditional quantization method; determining by an analog compression engine (ACE) whether the sampled analog signal is above or below a defined threshold, wherein the defined threshold includes one or more of an amplitude threshold, a frequency threshold, and a patterned adaptive threshold; adaptively manipulating the sampled signal mathematically through at least one of the DAC or voltage reference of the quantizer core; and outputting the digital signal.

26 Claims, 9 Drawing Sheets

SIGNAL STATISTICS AND COMPRESSION-BASED ANALOG-TO-DIGITAL CONVERTERS

The present application claims the benefit of and priority to U.S. Provisional Application No. 61/373,949 titled "Signal Statistics and Compression-Based Analog-to-Digital Converters," filed on Aug. 16, 2010, which is hereby incorporated by reference in its entirety.

FIELD

The present invention relates generally to analog-to-digital converters (ADCs), and more particularly, signal-aware adaptive lossless compression methods in an ADC.

BACKGROUND

In traditional analog-to-digital conversion, a signal is "blindly" converted without any consideration to what the signal type or statistics are. As a result, the conversion process is very power inefficient.

Figure 1:
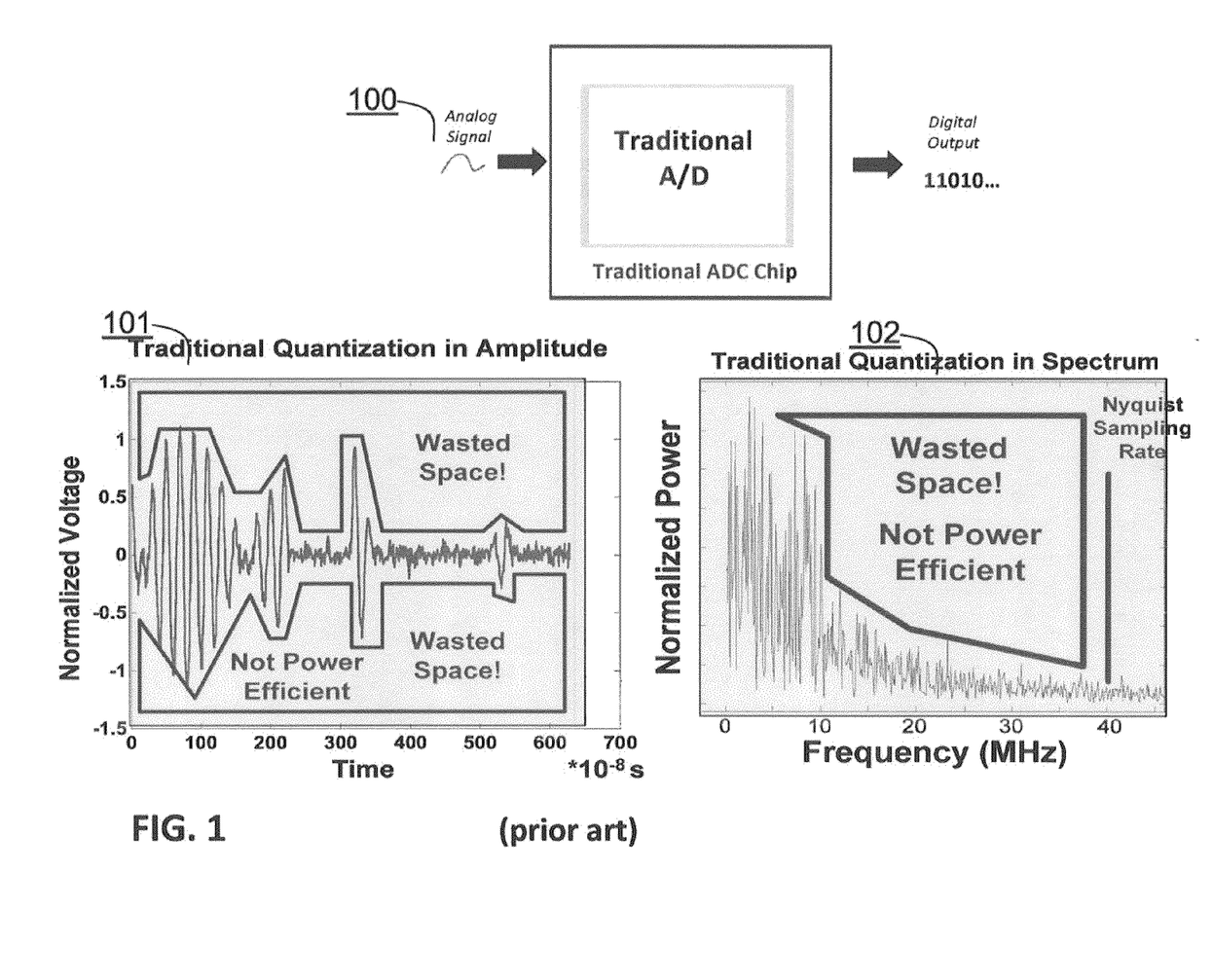
FIG. 1 illustrates a prior art quantization technique and its inefficiency in the amplitude and frequency domains.

FIG. 1 illustrates a prior art quantization technique and its inefficiency in the amplitude and frequency domains. In traditional analog-to-digital conversion 100, the full voltage scale and Nyquist spectrum of the input is quantized. In the amplitude domain 101, quantization of the wasted space not occupied by a signal results in power inefficiency. The traditional ADC suffers from inefficient signal digitization in the frequency domain as well 102. This is because the signal is not always occupying the entire Nyquist spectrum band and, in most applications, is concentrated at certain frequency portions of this band.

Figure 2:
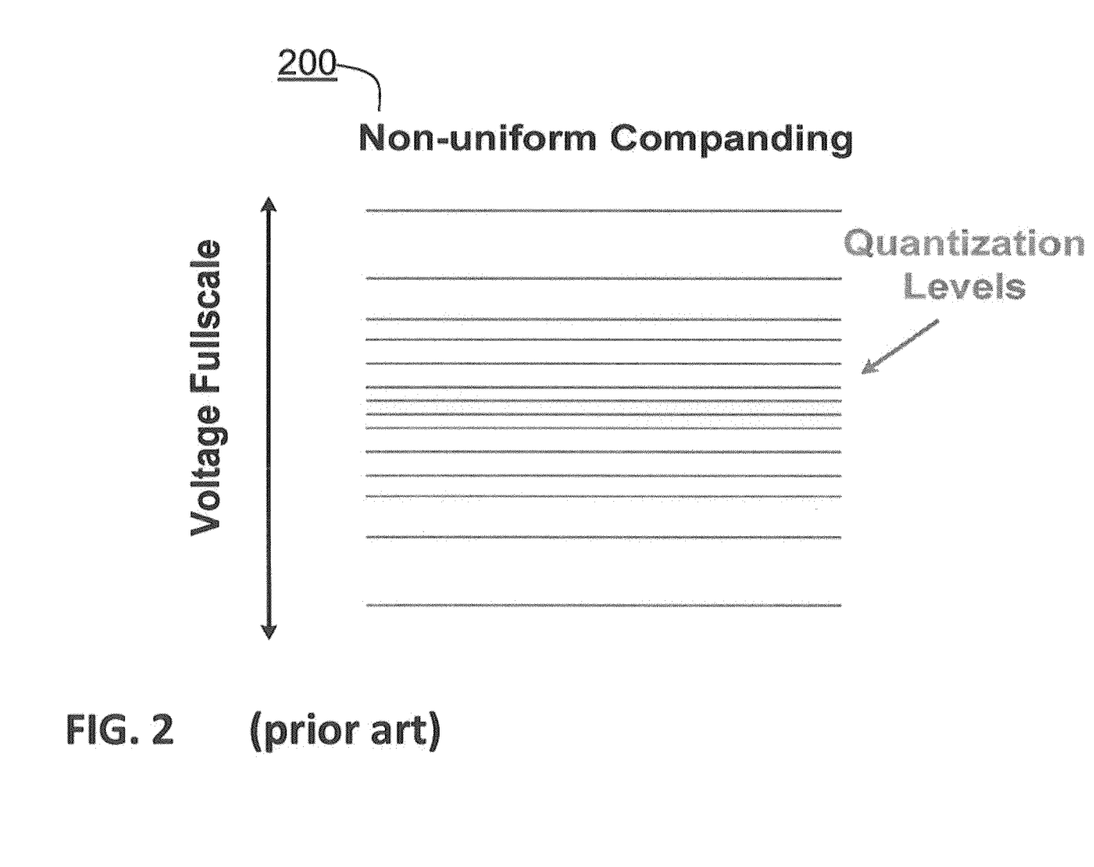
FIG. 2 illustrates a prior art companding quantization principle.

FIG. 2 illustrates a prior art companding quantization principle. The known method of companding 200, frequently used for audio signals, helps make the quantization process more efficient by designing the quantization levels non-uniformly throughout the voltage full scale according to the known input signal. This method, however, suffers from difficulty in implementation of non-uniform quantization levels. Furthermore, once the non-uniform levels are designed, the ADC is only optimum for a known signal statistic, and not for time-varying statistics or a multitude of signal types.

Also, there is only amplitude compression in companding, and no frequency compression. Because the quantization levels are non-uniformly designed, some signal levels can suffer significantly more quantization noise compared to other signal levels, which may result in severe loss of information.

Performance parameters in ADCs such as speed, resolution, and power can be designed to be programmable. While these parameters can be reprogrammed during ADC startup or to account for low frequency drifts using low frequency digital adaptation, adaptation time can only be changed every few microseconds to milliseconds, and ADC power down or power up can also take just as long. Thus, such methods cannot optimize themselves to fast frequency variations. Furthermore, the ADC cannot be powered down during signal inactivity, because the ADC is unaware of when the next signal may be coming in.

SUMMARY

A method of adaptively and losslessly quantizing an analog signal to a digital signal in an analog-to-digital converter (ADC), is disclosed. According to one embodiment, the quantizing is based on one or more of an instantaneous amplitude of the analog signal, frequencies of the analog signal, and patterned contents of the analog signal, and the method comprises sampling the analog signal; quanitizing the analog signal by a quantizer core, wherein the quantizer core comprises a digital-to-analog converter (DAC), a comparator, and a voltage reference, wherein the quantization is one of efficient lossless and adaptive compression quantization, or a traditional quantization method; determining by an analog compression engine (ACE) whether the sampled analog signal is above or below a defined threshold, wherein the defined threshold includes one or more of an amplitude threshold, a frequency threshold, and a patterned adaptive threshold; adaptively manipulating the sampled signal mathematically through at least one of the DAC or voltage reference of the quantizer core; and outputting the digital signal.

The systems, methods, features and advantages of the invention will be or will become apparent to one with skill in the art upon examination of the following figures and detailed description. It is intended that all such additional ADCs, methods, features and advantages be included within this description, be within the scope of the invention, and be protected by the accompanying claims. It is also intended that the invention is not limited to require the details of the example embodiments.

BRIEF DESCRIPTION

The accompanying drawings, which are included as part of the present specification, illustrate the presently preferred embodiment and, together with the general description given above and the detailed description of the preferred embodiment given below, serve to explain and teach the principles of the present invention.

It should be noted that the figures are not necessarily drawn to scale and that elements of similar structures or functions are generally represented by like reference numerals for illustrative purposes throughout the figures. It also should be

DETAILED DESCRIPTION

A method of adaptively and losslessly quantizing an analog signal to a digital signal in an analog-to-digital converter (ADC), is disclosed. According to one embodiment, the quantizing is based on one or more of an instantaneous amplitude of the analog signal, frequencies of the analog signal, and patterned contents of the analog signal, and the method comprises sampling the analog signal; quanitizing the analog signal by a quantizer core, wherein the quantizer core comprises a digital-to-analog converter (DAC), a comparator, and a voltage reference, wherein the quantization is one of efficient lossless and adaptive compression quantization, or a traditional quantization method; determining by an analog compression engine (ACE) whether the sampled analog signal is above or below a defined threshold, wherein the defined threshold includes one or more of an amplitude threshold, a frequency threshold, and a patterned adaptive threshold; adaptively manipulating the sampled signal mathematically through at least one of the DAC or voltage reference of the quantizer core; and outputting the digital signal.

Described herein are signal-aware adaptive lossless compression ADC architectures that overcome inefficiency and inaccuracy of the quantization process of prior art ADCs.

The benefits of signal-aware adaptive lossless compression-based ADC architectures as described herein come at no degradation of the effective number of bits (ENOB), signal quality and conversion rate compared to the traditional ADCs. Furthermore, the present system requires no pre-knowledge of the signal type. The present system automatically adapts to the power-optimized state of the input signal.

According to one embodiment, digitization is solely focused on the signal itself, in contrast to the conventional method of blindly digitizing over the entire ADC voltage full scale and full Nyquist band.

Figure 3:
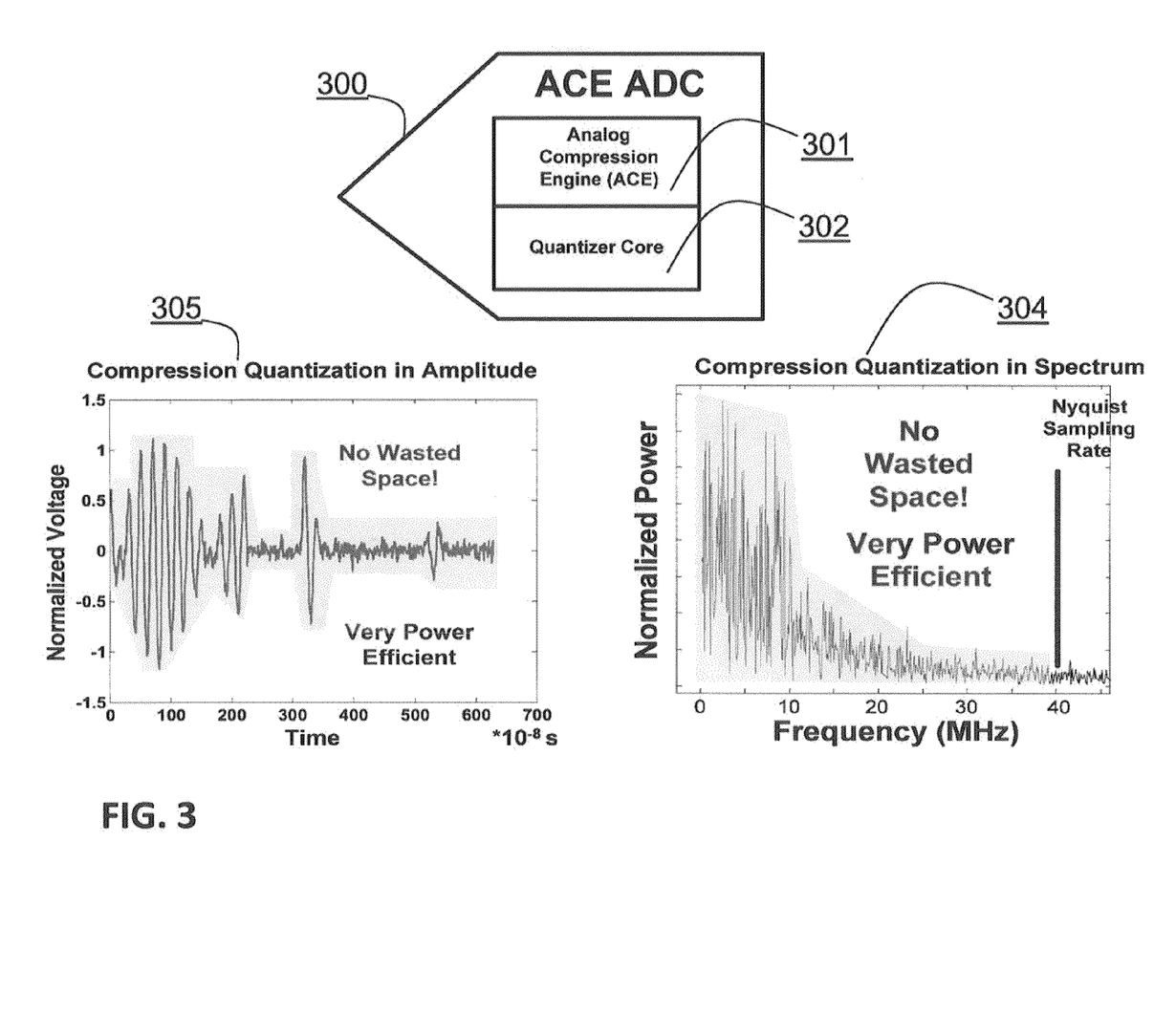
FIG. 3 illustrates an exemplary adaptive lossless compression based quantization process for use with the present system and its improved efficiency into the quantization process in the amplitude and frequency domain.

FIG. 3 illustrates an exemplary adaptive lossless compression based quantization process for use with the present system and its improved efficiency into the quantization process in the amplitude 303 and frequency 304 domains. An ACE ADC 300 includes a quantizer core 302 and a lossless adaptive analog compression engine (ACE) 301 for focusing only on the instantaneous amplitude, frequency, and patterned content. The result is very little wasted space and significantly improved power efficiency (303, 304). The ACE 301 operates in the mixed signal domain, containing both analog and digital parts. In contrast to prior art, the ACE ADC 300 is completely lossless, in that there is no degradation in signal quality compared to a traditional ADC.

The ACE ADC 300 automatically tracks, learns, and adapts to the incoming signal. It then autonomously adjusts its power consumption according to the signal needs on an ultra-fast sample-by-sample basis. In cases where signal conditions are predictable, the ACE ADC's 300 power is pushed to its lower limit. In events where the signal is very active and difficult to learn, the ACE ADC 300 consumes additional power in order to capture the full speed and resolution of the highly active signal. This ensures that there is no speed or resolution degradation compared to traditional ADCs. For most applications, ACE ADC 300 will result in substantially lower power than traditional ADCs.

The ACE ADC 300 uses an instantaneous comparison technique on each sample of the input signal to determine whether the instantaneous signal is to undergo lossless compression or is too large in amplitude or too fast in frequency to compress. In the former case, significant power can be saved using an efficient lossless compression quantization technique. In the latter case, the ADC will resort to traditional full scale and full spectrum quantization. Amplitude, frequency, patterns, and time domain parameters can all be adjusted and adaptively controlled to determine whether the instantaneous signal is compressible or not.

Figure 4:
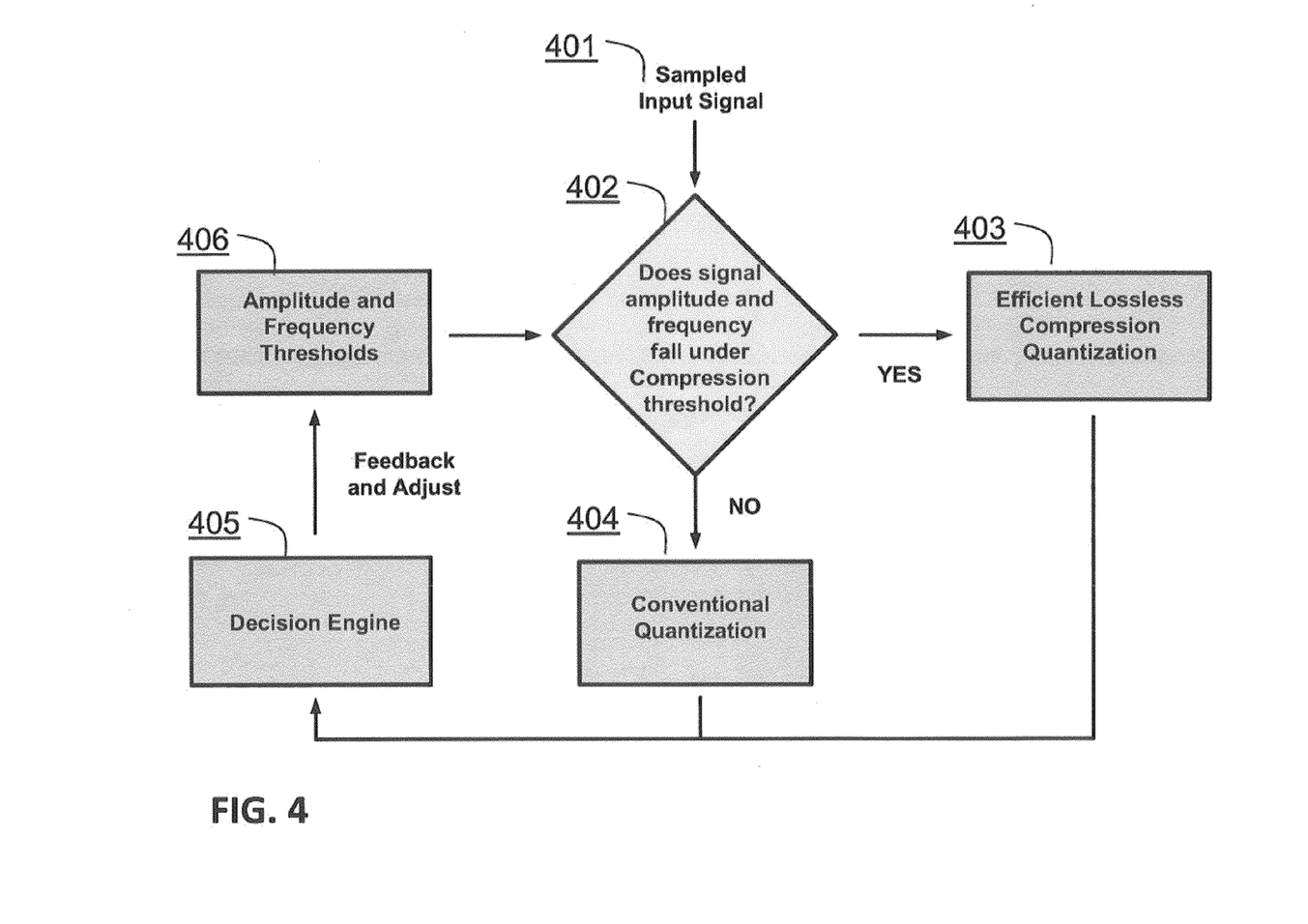
FIG. 4 illustrates an exemplary functional block diagram of a signal-aware adaptive lossless compression ADC, according to one embodiment.

FIG. 4 illustrates an exemplary functional block diagram of a signal-aware adaptive lossless compression ADC, according to one embodiment. The amplitude level and frequency power of a sampled input signal 401 is tested against a specific threshold 402. If the sampled signal falls below the threshold, the sampled signal is then quantized using an efficient lossless compression technique that saves power 403 (examples of which are described in the paragraphs that follow herein). If the sampled signal is above the threshold, it is quantized via conventional methods, such as that in a traditional ADC 404. The information based on whether the signal falls above or below the threshold is then fed to a decision engine 405. The decision engine applies feedback to the amplitude and frequency threshold 406 in order to adaptively and intelligently track variations of the signal. The threshold feedback then allows the ADC to quantize at its most power-optimized state based on the input signal conditions.

It should be appreciated that variations of the process depicted in FIG. 4 exist without departing from the nature and scope of the present disclosure. For example, amplitude or frequency compression features, or both at the same time, can be used or not used during the compression quantization process. The closed loop bandwidth of the decision engine can be programmable to track changes either fast or slow. The number of times the amplitude and/or frequency threshold is exceeded can be counted, and based on this decision, threshold value can be changed. The decision engine can also use sophisticated adaptive engines such as least mean-square error to track signal patterns in order to operate the ADC at its most power-optimized state. More than one guess may be made to determine whether or not the sampled signal will undergo efficient lossless compression quantization.

Figure 5:
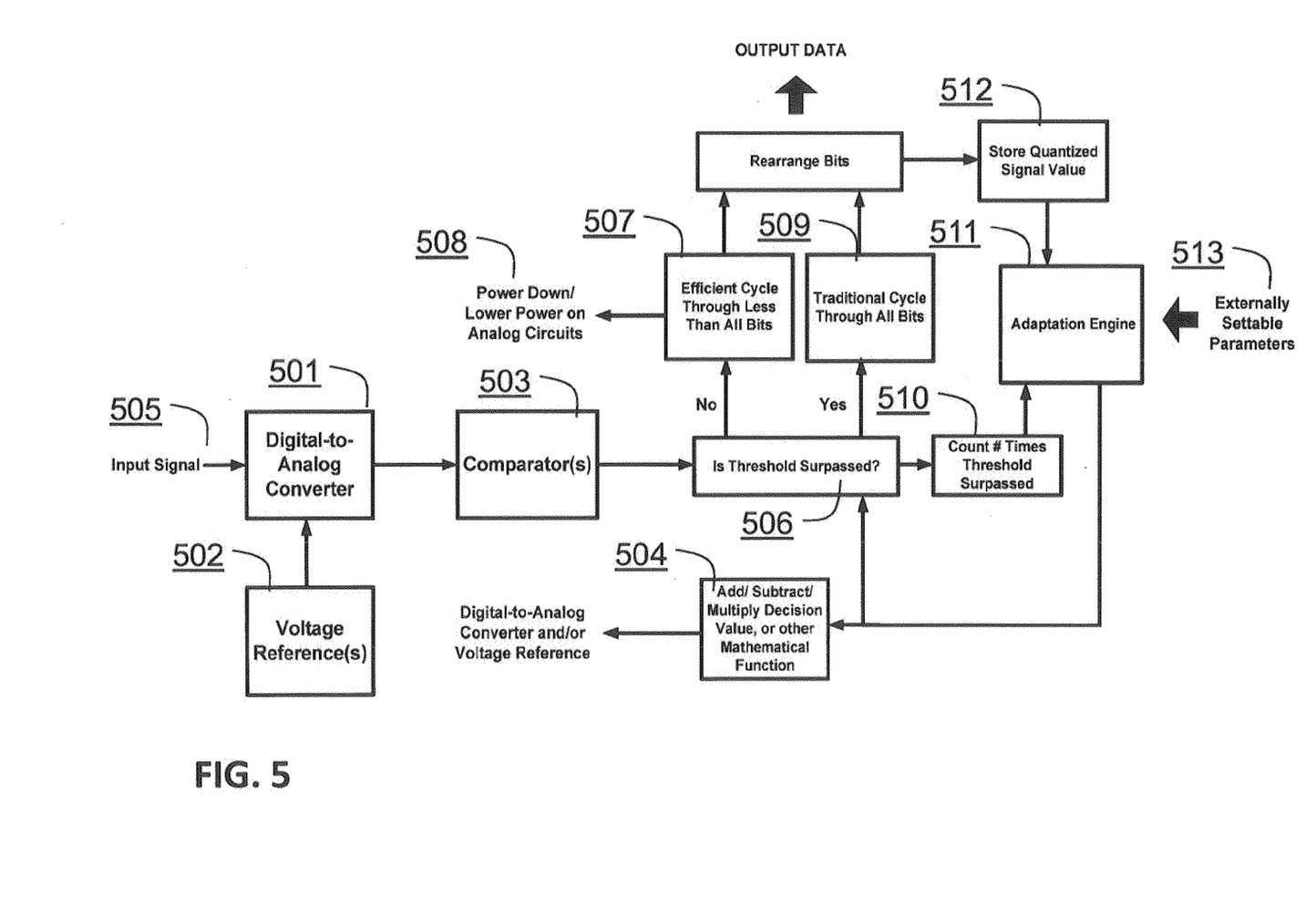
FIG. 5 illustrates an exemplary implementation block diagram of a signal-aware adaptive lossless compression ADC, according to one embodiment.

FIG. 5 illustrates an exemplary implementation block diagram of a signal-aware adaptive lossless compression ADC, according to one embodiment. An exemplary block diagram includes one or more digital-to-analog converter(s) (DAC) 501, voltage reference(s) 502, comparator(s) 503, and interstage amplifier(s) if more than one quantizer is used. A single or plurality of each circuit can be implemented in the ADC.

In a traditional ADC, a sampled signal is held in the DAC(s) and compared against the voltage reference(s) through the comparator(s). The quantized value of the sampled signal is then determined either successively in time, through a one shot comparison, or pipelined to other stages where the next bits of the signals are determined. Because the sampled signal has to go through the full cycle of decisions for each bit, if the true quantized value could somehow be determined without cycling through every bit, the power efficiency of the ADC can be improved. This can be done by predicting the signal's amplitude, frequency, or patterned content.

Referring now to FIG. 5, a preset value is added, subtracted, multiplied, or mathematically manipulated 504 on the sampled input signal 505 through the DAC 501 and/or the voltage reference 503. The output of the comparator(s) 503 is used to determine whether the arithmetically manipulated sampled signal is above or below a decision threshold 506. If the signal is below the threshold, then bits of the signal have already been predetermined, and therefore, determining the remaining bits requires less effort than traditionally going through all bits of the signal 507. This leads to greater power efficiency of the ACE ADC 508, while still maintaining the true quantized value of the sampled signal. If the signal is above the threshold, then the arithmetic manipulation on the sampled signal is undone on the DAC and/or reference voltage. Afterwards, the sampled signal goes through the traditional means of quantization, which is going through the full cycle of decisions for each significant bit 509. This allows the sampled signal to achieve the same signal quality as the traditional ADC even when the signal is difficult to learn or predict, albeit at the expense of more power consumption.

Regardless of whether the decision threshold is surpassed or not, the number of times the threshold is exceeded is counted within a certain time frame 510. Based on this count and the past recorded values of the quantized signal 512, the adaptation engine 511 determines what arithmetic addition, subtraction, multiplication, or other function to be manipulated 504 on the next sampled signal. The adaptation engine 511 also determines the threshold value to be compared against. Thus, the adaptation engine 511 can control the mathematical manipulation on the sampled input signal adaptively through time to maximize the chance of performing efficient partial bit quantization. Other parameters controlling the adaptation engine such as the number of counts to take into account, the time frame to record, the samples to consider, the threshold limits, and more, can be set externally 513.

Figure 6:
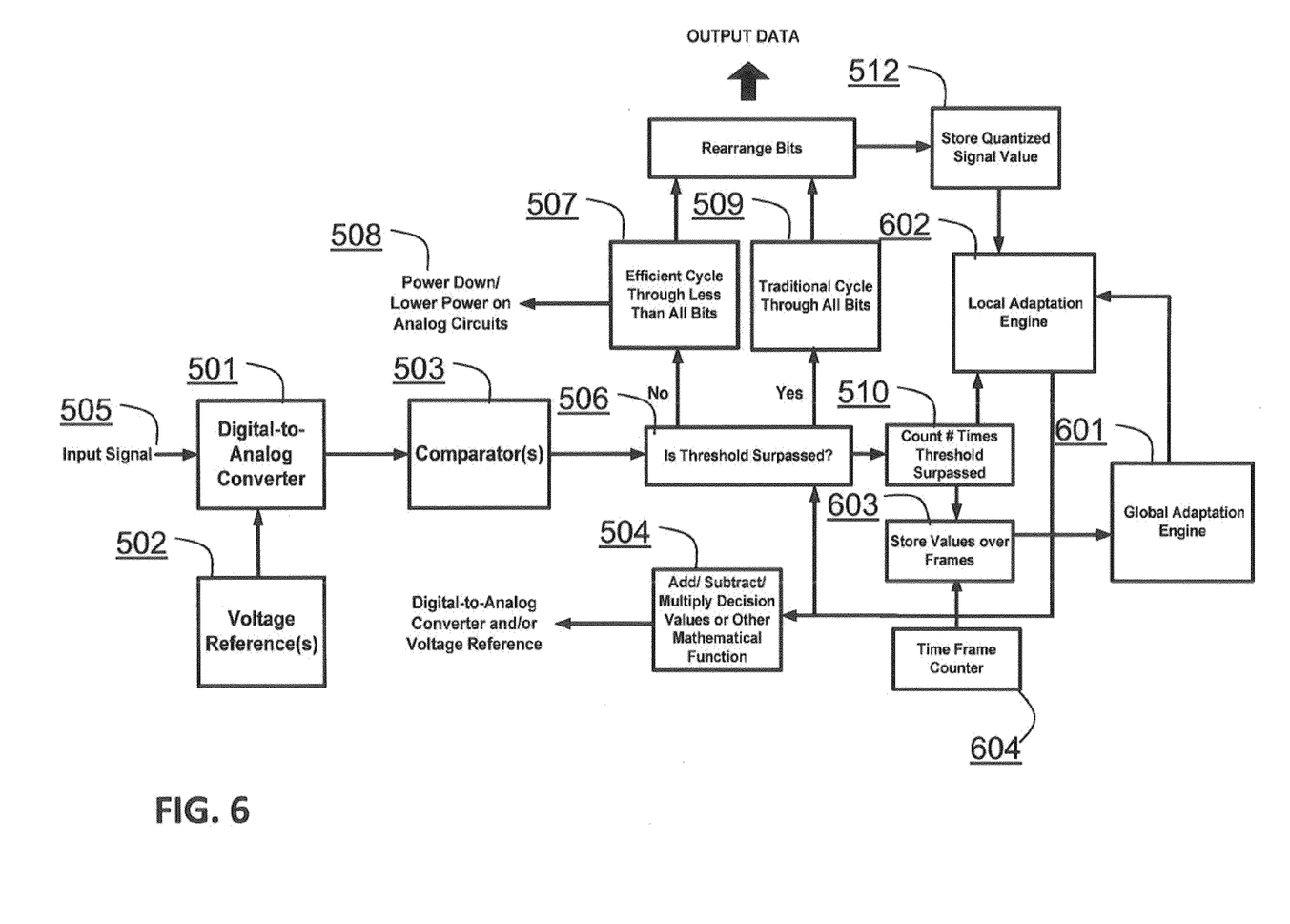
FIG. 6 illustrates an exemplary implementation block diagram of a signal-aware adaptive lossless compression ADC including a global adaptation engine for controlling the local adaptation engine, according one embodiment.

FIG. 6 illustrates an exemplary implementation block diagram of a signal-aware adaptive lossless compression ADC including a global adaptation engine for controlling the local adaptation engine, according one embodiment. Instead of the parameters of the adaptation engine being externally settable as depicted in FIG. 5, some or all of these parameters are controlled by a global adaption engine 601. The global adaptation engine 601 controls various parameters of the local adaptation engine 602, and therefore represents a slower high level feedback loop controlling faster low level feedback loop. The global adaptation engine 601 further optimizes and ensures that the probability of performing efficient partial bit quantization 507 over traditional full bit quantization 509 is maximized. The determinations of the global adaptation engine 601 take into account the number of times the threshold is exceeded 510 within a certain time frame (603, 604).

Figure 7:
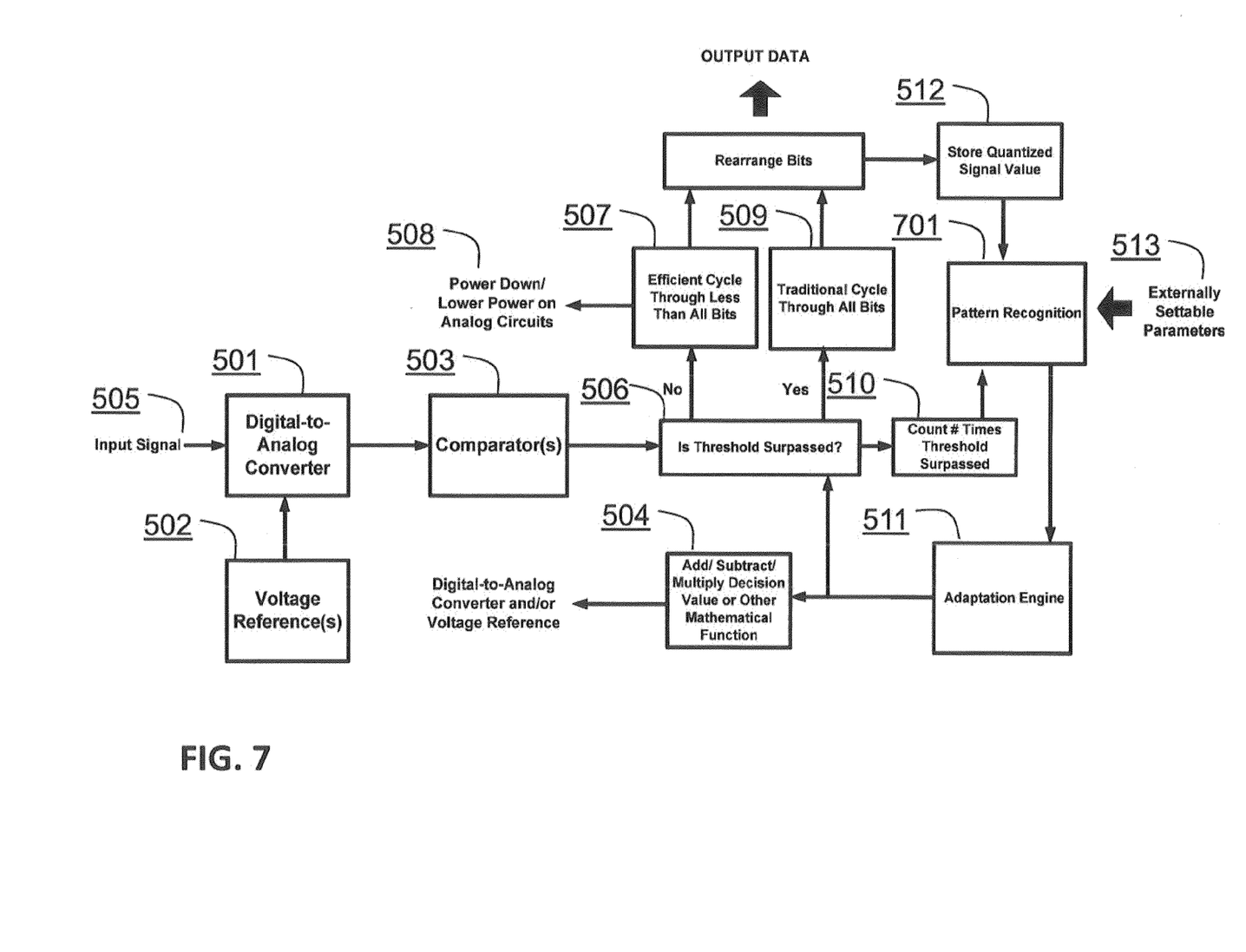
FIG. 7 illustrates an exemplary implementation block diagram of a signal-aware adaptive lossless compression ADC including a pattern recognition block for facilitating the adaptation engine, according to one embodiment.

FIG. 7 illustrates an exemplary implementation block diagram of a signal-aware adaptive lossless compression ADC including a pattern recognition block for facilitating the adaptation engine, according to one embodiment. A variation of that depicted in FIG. 5, here an intelligent pattern recognizer 701 is used to track and predict patterns within the signal, and this information is used to facilitate the decisions made by the adaptation engine 511. The pattern recognizer 701 can read from preloaded templates to correlate the signal with, or it can gather its own templates based on past history of the signal. This allows the ACE ADC not only to predict amplitude and frequency components of the signal, but to predict patterned information as well. The result is a further optimized adaptation engine 511 such that the probability of performing efficient partial bit quantization 507 over traditional full bit quantization 509 is maximized.

Figure 8:
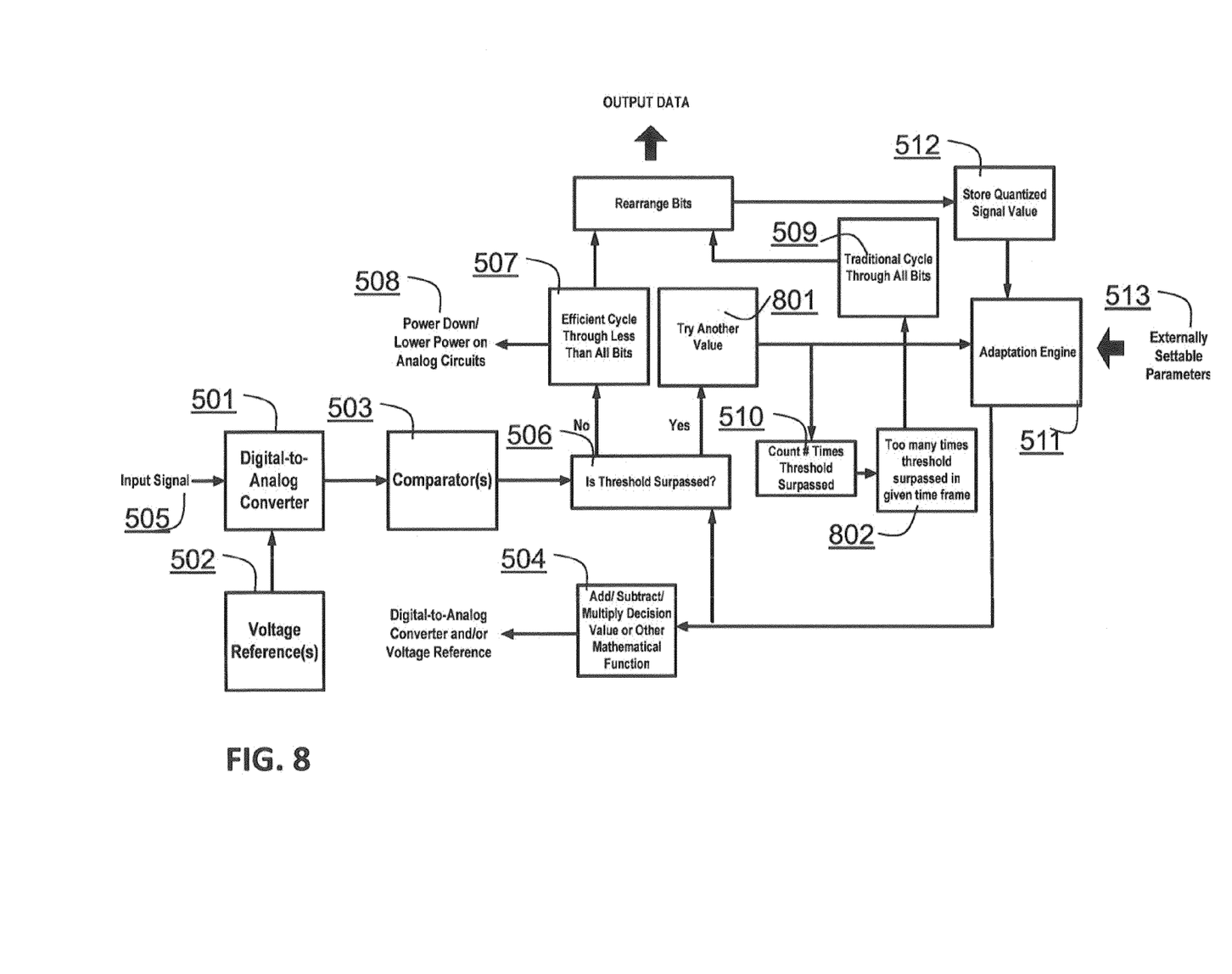
FIG. 8 illustrates an exemplary implementation block diagram of a signal-aware adaptive lossless compression ADC including testing multiple thresholds and mathematically manipulated sampled signals before resorting to traditional quantization, according to one embodiment.

FIG. 8 illustrates an exemplary implementation block diagram of a signal-aware adaptive lossless compression ADC including testing multiple thresholds and mathematically manipulated sampled signals before resorting to traditional quantization, according to one embodiment. A variation of that depicted in FIG. 5, here instead of going to traditional full bit quantization 509 right away when the threshold is exceeded 506, manipulating the sampled signal mathematically and comparing it against a different valued threshold 801 is performed multiple times before going to traditional full bit quantization. If, after a set amount of tries and the manipulated signal still is above the threshold 802, then traditional full bit quantization 509 is used.

Figure 9:
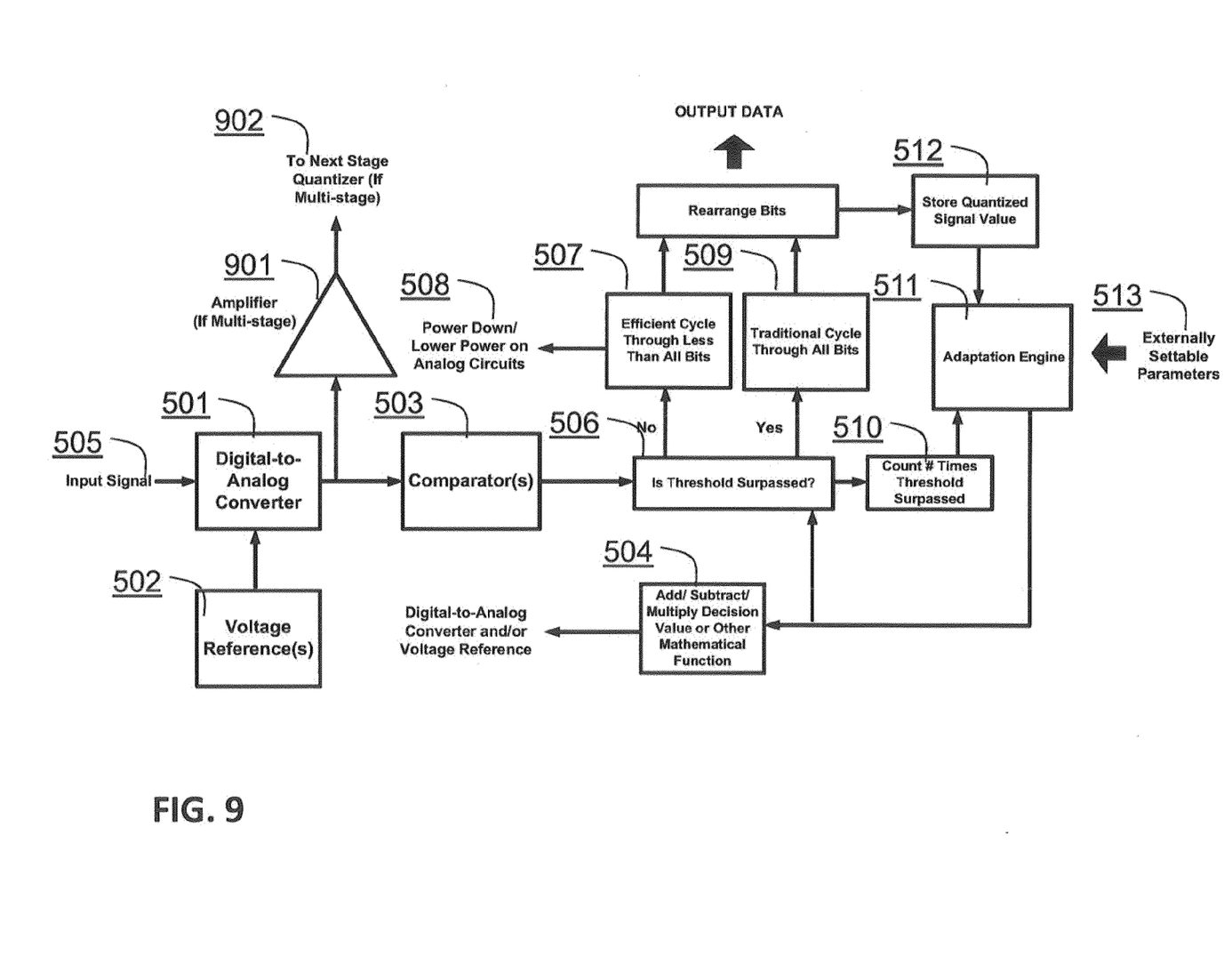
FIG. 9 illustrates an exemplary implementation block diagram of a signal-aware adaptive lossless compression ADC including a multi-stage ADC architecture, according to one embodiment.

FIG. 9 illustrates an exemplary implementation block diagram of a signal-aware adaptive lossless compression ADC including a multi-stage ADC architecture, according to one embodiment. A variation of that depicted in FIG. 5, here multiple stages are used in the ACE ADC to determine all bits of the signal. Each stage determines a predetermined amount of bits, being anywhere between 1 bit to N–1 bits for an N bit ADC. An inter-stage amplifier 901 is used to pass on to the next stage 902 the amplified residue of the signal after determining the bits of the present stage.

The principles of the ACE ADC can be applied to any well known ADC architecture, including but not limited to pipelined, successive approximation (SAR), flash, time-interleaved, delta sigma, or folding ADCs.

In the description above, for purposes of explanation only, specific nomenclature is set forth to provide a thorough understanding of the present disclosure. However, it will be apparent to one skilled in the art that these specific details are not required to practice the teachings of the present disclosure.

The various features of the representative examples and the dependent claims may be combined in ways that are not specifically and explicitly enumerated in order to provide additional useful embodiments of the present teachings. It is also expressly noted that all value ranges or indications of groups of entities disclose every possible intermediate value or intermediate entity for the purpose of original disclosure, as well as for the purpose of restricting the claimed subject matter.

Signal statistics and compression-based analog-to-digital converters have been disclosed. It is understood that the embodiments described herein are for the purpose of elucidation and should not be considered limiting the subject matter of the disclosure. Various modifications, uses, substitutions, combinations, improvements, methods of productions without departing from the scope or spirit of the present invention would be evident to a person skilled in the art.

What is claimed is:

1. A method of adaptively and losslessly quantizing an analog signal to a digital signal in an analog-to-digital converter (ADC), wherein the quantizing is based on one or more of an instantaneous amplitude of the analog signal, frequencies of the analog signal, and patterned contents of the analog signal, the method comprising:
   sampling the analog signal;
   quantizing the analog signal by a quantizer core, wherein the quantizer core comprises a digital-to-analog converter (DAC), a comparator, and a voltage reference, wherein the quantization is one of efficient lossless and adaptive compression quantization, or a traditional quantization method;
   determining by an analog compression engine (ACE) whether the sampled analog signal is above or below a defined threshold, wherein the defined threshold includes one or more of an amplitude threshold, a frequency threshold, and patterned adaptive threshold;
   adaptively manipulating the sampled signal mathematically through at least one of the DAC or voltage reference of the quantizer core; and
   outputting the digital signal.

2. The method of the claim 1, wherein the efficient lossless compression quantization performs tests on a subset of bits to produce a full digital signal.

3. The method of the claim 1, wherein the traditional quantization method performs tests on all bits to produce a full digital signal.

4. The method of the claim 1, wherein the digital-to-analog converter holds the sampled signal and can mathematically alter the value of the sampled signal, wherein the mathematical alteration is controlled by the ACE.

5. The method of the claim 1, wherein the voltage reference serves as a value which the quantization process can be compared against to determine bits of the sampled signal, and the voltage reference is mathematically altered by the ACE.

6. The method of the claim 5, wherein voltage reference is replaced by a current or charge reference.

7. The method of the claim 1, wherein the comparator performs determining whether the mathematically manipulated signal is greater than or less than an adaptive threshold,
determining bits during the signal quantization process, and
determining whether to use efficient lossless compression quantization or traditional quantization.

8. The method of the claim 1, wherein the ACE counts the number of times efficient lossless compression quantization is used within a preset number of samples.

9. The method of the claim 1, wherein the quantized sampled signal values are recorded and stored over a preset number of samples.

10. The method of the claim 1, wherein the ACE includes an adaptive engine that determines, based on the number of times efficient lossless compression quantization is used, the quantized sampled signal values, and externally set parameters, a comparison threshold and how to mathematically manipulate the sampled input signal.

11. The method of the claim 10, wherein the externally set parameters include one or more of a number of counts, a time frame to record, samples to consider, and threshold limits.

12. The method of the claim 11, wherein another variation is that the externally set parameters are predefined and non-programmable.

13. The method of the claim 1, wherein bits are rearranged and filled in such that the digital signal is a true quantized value of the sampled signal regardless of quantization method.

14. The method of the claim 2, wherein parts of the signal bits not tested against are determined from the adaptive threshold value and the mathematical manipulations on the sampled input signal through the quantizer core's DAC and/or reference.

15. The method of the claim 1, wherein a variation of claim 1 is that the ACE has an adaptive engine that takes into account the number of times efficient lossless compression quantization is used, the quantized sampled signal values, and globally set parameters in order to make a decision on what value to change the comparison threshold at and how to perform mathematical manipulations on the sampled input signal through the quantizer core's DAC and/or reference.

16. The method of the claim 15, wherein globally set parameters include, but are not limited to, the number of counts to take into account, the time frame to record, the samples to consider, and the threshold limits are determined based on the number of times the threshold is exceeded within a set time frame.

17. The method of the claim 1, further comprising tracking and predicting patterns within the signal, wherein the tracking and predicting is performed by an intelligent pattern recognizer, and information related to the patterns is used to facilitate decisions made by an adaptive engine.

18. The method of the claim 17, wherein the pattern recognizer can read from preloaded templates to correlate the signal with, or it can gather its own templates based on past history of the signal.

19. The method of the claim 1, wherein traditional full bit quantization is used if the manipulated signal still is above the threshold after a set number of comparisons.

20. The method of the claim 1, wherein a plurality of stages are used to determine all bits of the signal.

21. The method of the claim 20, wherein each stage of the plurality of stages determines a predetermined amount of bits, being anywhere between 1 bit to N−1 bits for an N bit ADC.

22. The method of the claim 21, wherein an inter-stage amplifier is used to pass on to a next stage an amplified residue of the signal after determining the bits of the present stage.

23. The method of the claim 1, wherein when the efficient lossless compression quantization method is used, analog and mixed signal portions of the ADC are powered down upon early completion of partial bits.

24. The method of the claim 1, further comprising automatically tracking, adapting, and learning the analog signal, and autonomously adjusting power consumption according to the signal needs on an ultra-fast sample-by-sample basis.

25. The method of the claim 1, wherein the ADC is one of pipelined, successive approximation (SAR), flash, time-interleaved, delta sigma, or folding.

26. The method of the claim 1, wherein no signal pre-knowledge is needed to achieve functionality and lower power.

* * * * *